(12) United States Patent
Hsu et al.

(10) Patent No.: US 6,861,207 B2
(45) Date of Patent: Mar. 1, 2005

(54) METHOD FOR FABRICATING MICROLENS WITH LITHOGRAPHIC PROCESS

(75) Inventors: Hung-Jen Hsu, Taoyuan (TW); Chih-Kung Chang, Hsin-Chu (TW); Fu-Tien Weng, Hsin-Chu (TW); Te-Fu Tseng, Hsin-Chu (TW); Chin-Chen Kuo, Hsin-Chu (TW); Chiung-Yuan Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/611,645

(22) Filed: Jun. 30, 2003

(65) Prior Publication Data

US 2004/0265752 A1 Dec. 30, 2004

(51) Int. Cl.[7] .............................. G02B 3/00; H01L 27/14
(52) U.S. Cl. ........................................ 430/321; 438/70
(58) Field of Search ................................ 430/321, 330; 438/69, 70; 328/71

(56) References Cited

U.S. PATENT DOCUMENTS 5,426,058 A  * 6/1995 Nakai et al. ................. 438/68

6,200,712 B1  3/2001 Fan et al.
6,395,576 B1  5/2002 Chang et al.
6,511,779 B1  1/2003 Weng et al.

FOREIGN PATENT DOCUMENTS

JP       6-302794 A   * 10/1994
KR  2001-0010306 A   *  2/2004

OTHER PUBLICATIONS

English language translation of KR 2001–0010306, Feb. 2001.*

English abstract of KR 2001–010306, Feb. 5, 2001, Kim, with figure.*

* cited by examiner

Primary Examiner—John A. McPherson
(74) Attorney, Agent, or Firm—Slater & Matsil, L.L.P.

(57) ABSTRACT

A method of fabricating microlens devices. The method includes filling the bond pad areas and scribe lines, or other areas, to improve the topography of the semiconductor wafer surface. A microlens material is applied to the surface after the bond pad areas and scribe lines have been filled. Because of the improved topography, the thickness of the microlens material is more uniform, thereby facilitating the formation of uniformly shaped microlenses.

26 Claims, 4 Drawing Sheets

METHOD FOR FABRICATING MICROLENS WITH LITHOGRAPHIC PROCESS

TECHNICAL FIELD

The present invention relates to the field of semiconductor devices, and more specifically, to the fabrication of microlens structures using a lithographic process.

BACKGROUND

Digital imaging systems such as digital cameras utilize semiconductor chips equipped with photo-sensitive electronic components, such as photo-diodes. The digital imaging systems typically capture light information in a series of pixels. Commonly, the pixels are arranged in an array of rows and columns, such as 1024×768 pixels. Each pixel is represented by at least one photo-sensitive component. In applications requiring the capture of color, color filters may be used to capture the specific colors of the received light, and each pixel may be represented by more than one photo-sensitive component.

Generally, a microlens guides the light to the photo-sensitive component, essentially acting as the collection point for the digital imaging system. A microlens is a tiny lens formed on a semiconductor chip above each photo-sensitive component. Because the collected light passes through the microlens, it is important that the microlens be free of as many defects as possible.

FIG. 1 is a cross-section view of a semiconductor wafer configured with a microlens imaging system, although other configurations are possible. Microlenses 110 are located on a planarization layer 112, which acts as a spacer. The microlenses 110 capture light and directs the light through color filters 114 to photo-diodes 116 formed in the active region 118 of a wafer. A second planarization layer 120 may be located between the color filters 114 and the active region 118. A bond pad area 122 and scribe line 124 are typically formed as indentations in the wafer.

Microlenses are generally formed by applying a layer of microlens material on a semiconductor chip. The microlens material, such as a mixture of ethyl lactate and propyleneglycol monoether ether acetate and a mixture of propyleneglycol ether acetate and phenolic resin, also acts as a photo-resist material, i.e., the microlens material may be masked, exposed, and developed to remove unwanted microlens material. Suitable microlens material includes MFR 380 series and MFR344 series; manufactured by JSR Corporation of Tokyo, Japan.

After the microlens material has been applied, exposed, and developed, a reflow process is performed to cause the remaining microlenses to form the preferred uniform symmetrical lens shape.

In order to achieve the preferred uniform and symmetrical lens shape, it is desirable that the microlens material be applied uniformly. If the microlens material is not applied uniformly, the microlens material may not reflow evenly and may create a non-uniform lens. The non-uniform lens may cause a stripe defect, resulting in a signal deviation. In many applications, the signal deviation is too great for the devices to function satisfactorily.

The topography of the semiconductor chip has an effect on the uniformity of the microlens material. For example, if the topography of the semiconductor chip contains valleys or indentations, the indentations may cause a non-uniform distribution of the microlens material. In particular, the bond pad area and the scribe line has been known to cause an uneven distribution of microlens material.

Therefore, there is a need for a method for fabricating microlenses to reduce signal deviation caused by the semiconductor chip topography.

SUMMARY OF THE INVENTION

These and other problems are generally reduced, solved or circumvented, and technical advantages are generally achieved, by embodiments of the present invention which provides a method of fabricating microlens devices.

In one embodiment of the present invention, indentations, such as bond pad areas and scribe lines, are filled with a filler material. The filler material creates a flatter surface upon which a uniform layer of microlens material may be formed. The filler material is removed after the layer of microlens material has been formed.

In another embodiment of the present invention, the microlens material and the filler material comprise photoresist material. The indentations are filled with one photoresist material to form a flatter surface. A layer of microlens material is then formed and masked. The excess microlens material and the filler material may then be removed by exposing and developing. This embodiment provides for a lithographic process to fill the indentation and to remove the filler material at a later time.

In yet another embodiment of the present invention, the indentations are filled with a filler material and a layer of microlens material is formed. The microlens material is masked, exposed, and developed to define the areas that will become the microlenses. The filler material is then removed by a masking and etching process.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
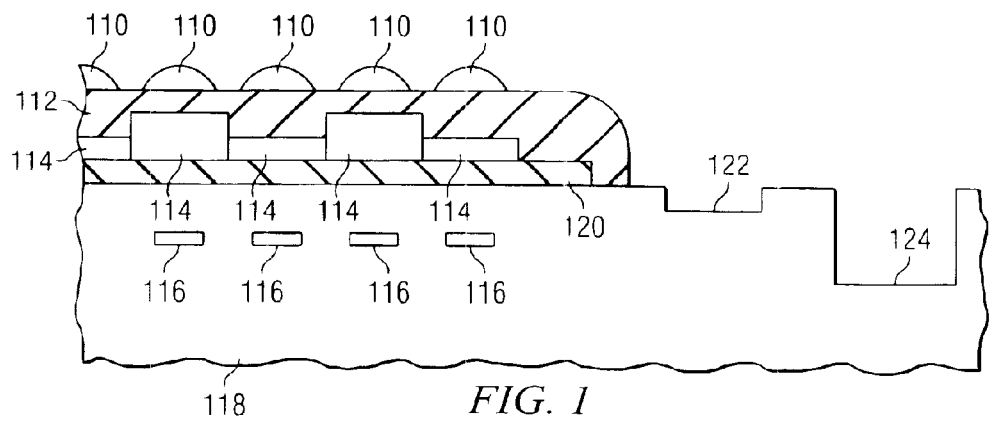
FIG. 1 is a cross-section view of a wafer illustrating the formation of microlenses.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIGS. 2a–2d illustrate cross-section views of a wafer during various steps of a first method embodiment of the present invention. The process begins in FIG. 2a, wherein a wafer 200 has been prepared for applying a microlens material in accordance with standard processing techniques known in the art. Generally, the wafer 200 comprises a planarization layer 212i which acts as a spacer between the microlens (not shown, to be applied in a later step) and color filters 214. The color filters 214 are located on a second planarization layer 220 that acts as a spacer between the color filters 214 and photo-diodes 216 formed in active region 218.

A bond pad area 222 provides a connection point for electrical leads, and a scribe line 224 provides a separation point between die on a wafer. Preferably, the scribe line 224 is substantially filled with a photoresist material during a previous processing step, such as the processing steps performed in creating the planarization layer 220 and planarization layer 212.

Figure 2A:
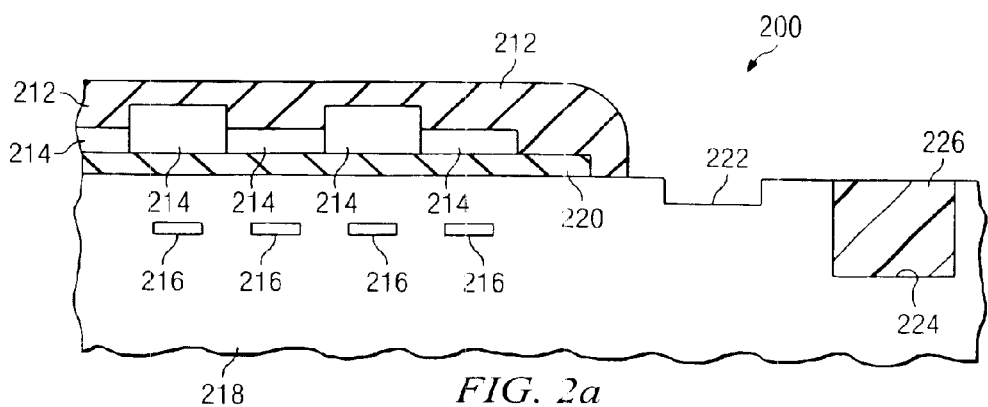
FIGS. 2a–2d are cross-section views of a wafer illustrating a process of forming microlens devices in accordance with a first method embodiment of the present invention.
Figure 2B:
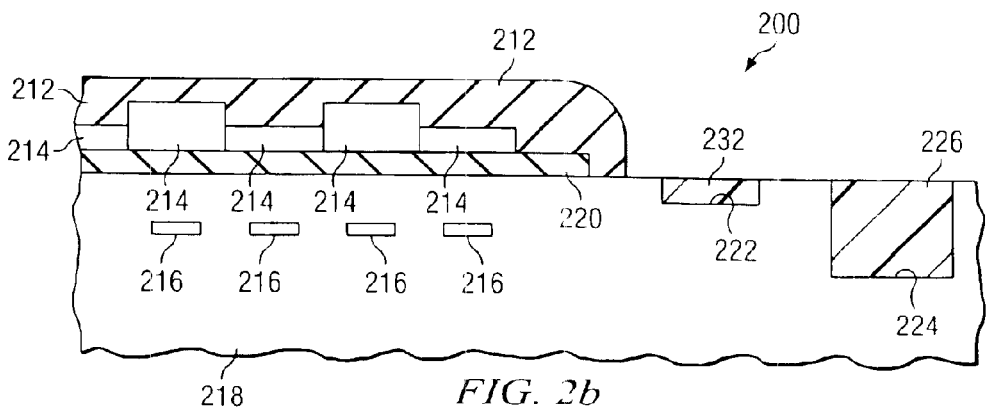

FIG. 2b is a cross-section view of wafer 200 illustrated in FIG. 2a after the bond pad area 222 has been substantially filled with photoresist filler 232. The bond pad area 222 can be filled, for example, by applying a photoresist layer. The photoresist layer may be patterned using photolithography as is known in the art.

Preferably, the photoresist filler 232 is a positive photoresist, i.e., a photoresist filler that becomes soluble in a developing solution after being exposed to an energy source, such as ultra-violet light. A mask is used to pattern the photoresist. In this embodiment in which a positive photoresist is used, the mask would prevent the photoresist filler 232 located in the bond pad area 222 from being exposed. Accordingly, the photoresist filler 232 remains after developing.

Preferably, the photoresist layer comprises a high-sensitivity positive photoresist material such as a mixture comprising poly ethylene, poly methyl methacrylate (PMMA), poly glycidol methacrylate (PGMA), propylene glycol monoethyl ether Acetate, ethylene glycol monoethyl ether acetate, cyclized 1,4-cis polyisoprene, novolak resin, metacrylate resin, cresol formaldehyde resin, ethyl lactate, and ethyl 3-ethoxypropionate.

The photoresist material is preferably deposited having a thickness substantially equivalent to the depth of the bond pad area 222. Thus, in a common design wherein the bond pad area 222 is about 1.5 to 2.0 um, the photoresist layer is preferably about 1.5 to 2.0 um in thickness.

Although a negative photoresist may be used, it is preferred that a positive photoresist be used. Microlens materials (discussed in greater, detail below with reference to FIGS. 2c and 2d) are most commonly available as a positive photoresist. By using a positive photoresist for the microlens material and the photoresist filler 232, the process steps may be simplified and reduced. For example, by using positive photoresist for the microlens material and the photoresist filler 232, the same developing step may be used to remove both materials. Furthermore, in an alternative embodiment, a negative photoresist may be used for one or both of the microlens material and the photoresist filler 232. The use of negative photoresist, however, may require more complex processes; such as the process described below with reference to FIGS. 3a–3e.

Figure 2C:
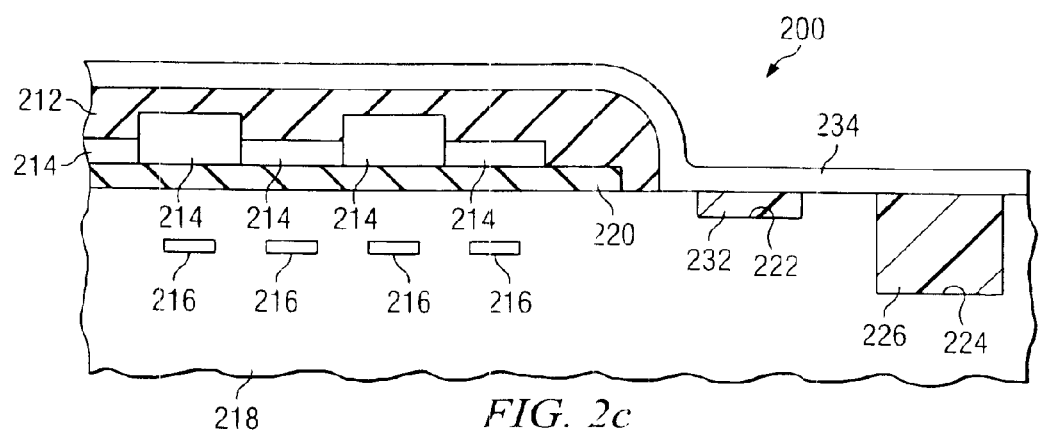

FIG. 2c is a cross-section view of wafer 200 illustrated in FIG. 2b after a microlens layer 234 has been applied. Preferably, the microlens layer 234 is about 0.5 um to 2.0 um in thickness, but preferably is about 1.0 um thick.

By filling the bond pad area 222 and the scribe line 224 with photoresist material prior to the application of the microlens layer, and thereby improving the topography of the wafer 200, the distribution of the microlens layer 234 is more uniform. The greater uniformity of the microlens layer 234 allows the microlens (not shown in FIG. 2c) to obtain a more uniform shape, thereby reducing or eliminating signal deviation.

Figure 2D:
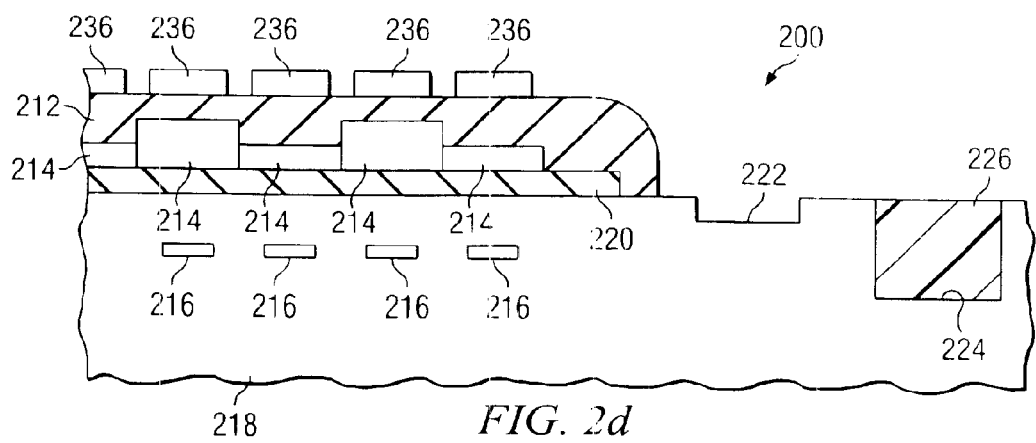

FIG. 2d is a cross-section view of wafer 200 illustrated in FIG. 2c after removing the excess microlens layer 234 (FIG. 2c) and the photoresist filler 232 (FIG. 2c). In the preferred embodiment, this step includes two exposure steps and one developing step. In the first exposure step, the microlens layer 234 is masked and exposed to define the microlenses 236. Preferably, the microlens layer the exposure energy is about 60 mj to 600 mj, but most preferably is about 200 mj to 350 mj.

In the preferred embodiment in which the microlens material is a positive photoresist, the mask contains opaque areas where the microlenses are to be located, thereby protecting the microlens area from being exposed and removed during developing.

In the second exposure, the photoresist filler 232 (FIG. 2c) are exposed. In the preferred embodiment, the material used for the microlens layer 234 and the photoresist fillers 232 react with different energies, and accordingly, an exposure is required to remove each of the materials. The mask for this exposure allows the photoresist filler 232 to be exposed. The photoresist filler 226, located in the scribe line 224, remain. Alternatively, however, the photoresist filler 226 may be removed or partially removed.

The developing step removes the excess microlens material and the photoresist filler 226 located in the bond pad area 222.

Thereafter, standard processes may be utilized to reflow the microlens as is known in the art FIGS. 3a–3e illustrate cross-section views of a wafer during various steps of a second method embodiment of the present invention. The process assumes a wafer 300 previously fabricated and prepared for fabricating microlenses. A suitable wafer 300 is discussed above in reference to wafer 200 of FIG. 2a. Thus, for the purposes of this description, the second embodiment is based upon wafer 200 of FIG. 2a, wherein like reference numerals in FIGS. 3a–3e represent the respective elements in FIG. 2a.

Figure 3A:
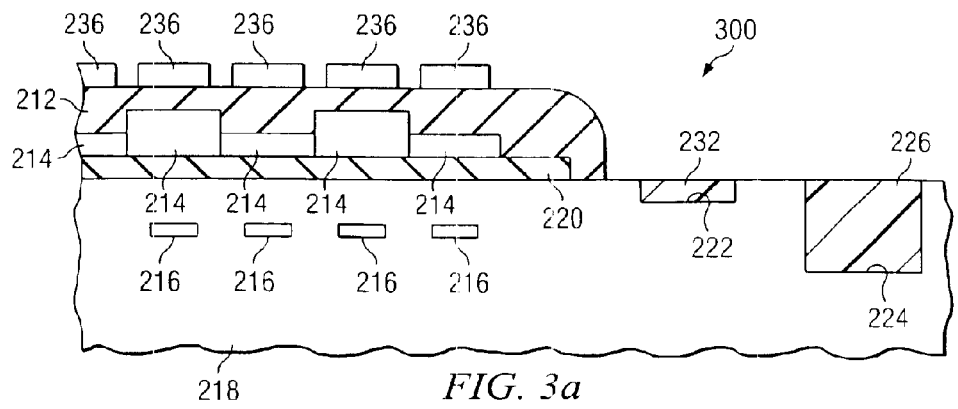
FIGS. 3a–3e are cross-section views of a wafer illustrating a process of forming microlens devices in accordance with a second method embodiment of the present invention.

Referring now to FIG. 3a, wherein a bond pad area 222 and scribe line 224 have been filled with photoresist fillers 232 and 226, respectively, and microlens 236 have been formed. One method of fabricating wafer 300 of FIG. 3a is described above in reference to FIGS. 2a–2d, except that the photoresist fillers 232 and 226 remain, such as may be the case if the exposure step to expose the photoresist fillers 232 and 226 was not performed as described above in reference to FIG. 2d. Generally, the following discussion presents a second embodiment of the present invention in which an alternative method is disclosed for removing the photoresist filler 232. The photoresist filler 226, located in the scribe line, may remain.

Figure 3B:
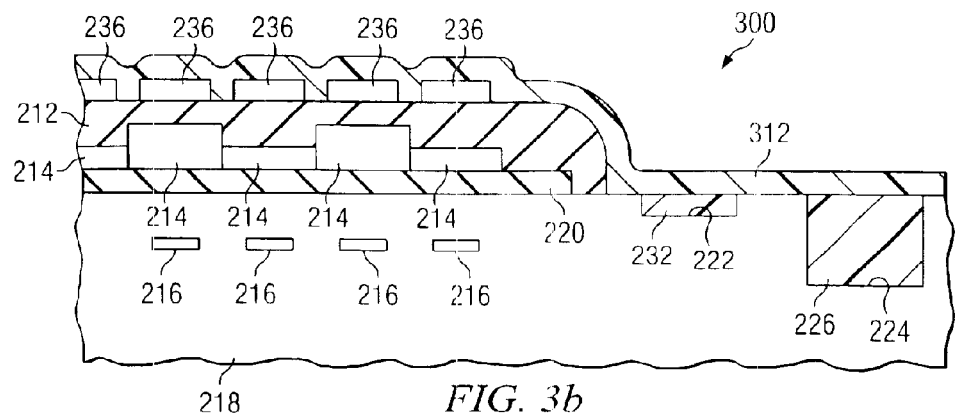

FIG. 3b is a cross-section of wafer 300 illustrated in FIG. 3b after a patterned mask 312, such as a photoresist mask, is formed. The patterned mask 312 may comprise a photoresist material. The photoresist material is masked and exposed to define the areas of the photoresist filler 232 that are to be removed, preferably via an etching process. After exposure, the photoresist material is developed to remove the exposed areas of the photoresist and expose the photoresist filler 232.

Figure 3C:
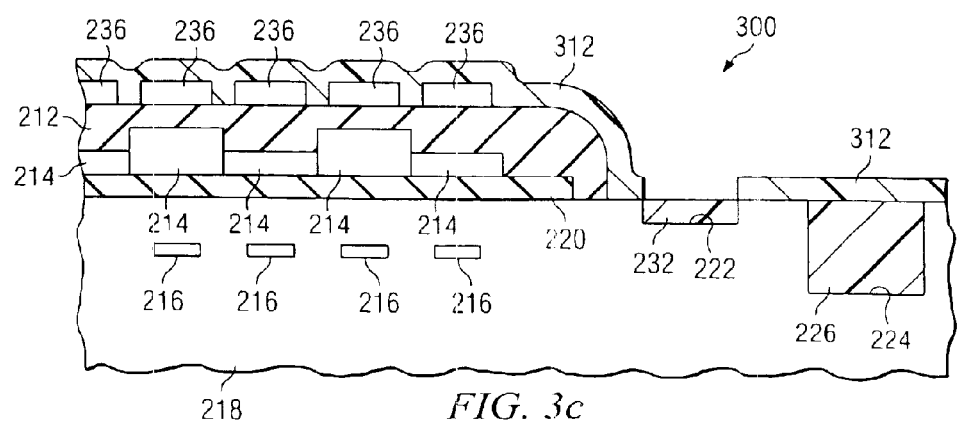

FIG. 3c is a cross-section view of the wafer 300 illustrated in FIG. 3b after the patterned mask 312 (FIG. 3b) has been exposed and developed. The wafer 300 is then subjected to an etching process to remove the exposed areas of the photoresist filler 232. The etching process may be a wet or dry, anisotropic or isotropic, etch process, but preferably is an anisotropic dry etch process.

Figure 3D:
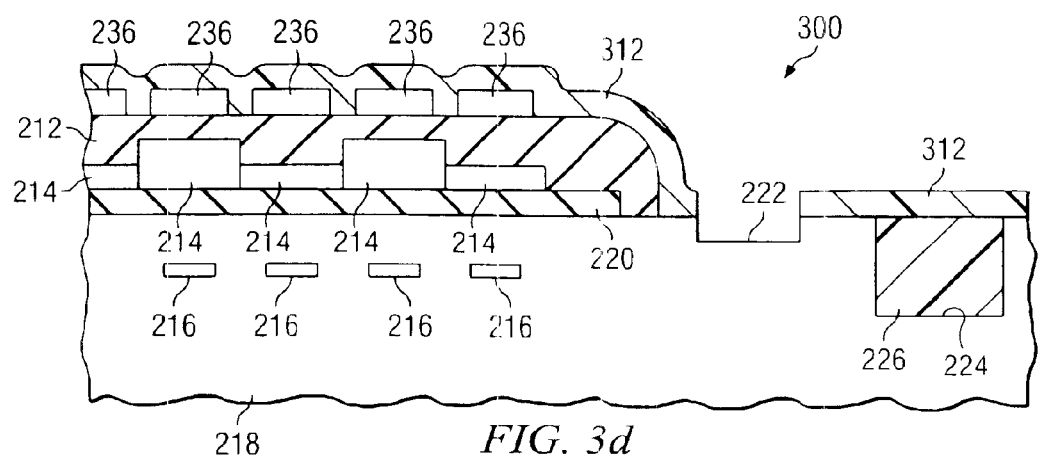

FIG. 3*d* is a cross-section view of the wafer 300 illustrated in FIG. 3*c* after the photoresist filler 232 (FIG. 3*c*) have been removed from the bond pad area 222 by the etching process discussed above. Alternatively, the photoresist filler 226 may also be removed.

Figure 3E:
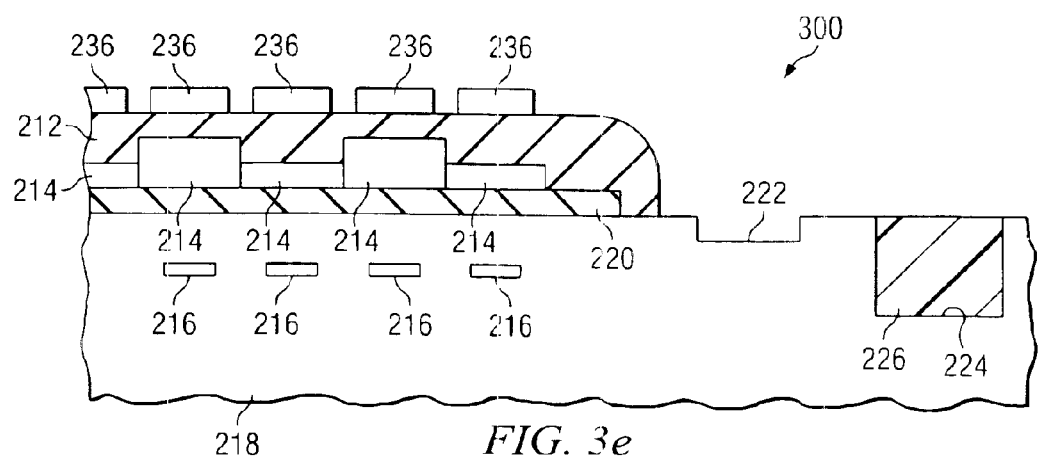

FIG. 3*e* is a cross-section view of the wafer 300 illustrated in FIG. 3*d* after the patterned mask 312 (FIG. 3*d*) is removed. The patterned mask 312 may be removed by a wet dip in photoresist stripper, such as EKC 270 remover manufactured by EKC Technologies of Danville, Calif., for example.

Thereafter, standard processes may be utilized to reflow the microlens as is known in the art.

Although particular embodiments of the invention have been described in detail, it is understood that the invention is not limited correspondingly in scope, but includes all changes, modifications, and equivalents coming within the spirit and terms of the claims appended hereto. For example, differing types of mask materials and photoresist materials may be used, negative photoresist may be used, other areas besides the bond pad area and scribe line may be filled to further alter the chip topography, and the like. Accordingly, it is understood that this invention may be extended to other structures and materials, and thus, the specification and figures are to be regarded in an illustrative rather than a restrictive sense.

What is claimed is:

1. A method of forming a microlens comprising the steps of:
   providing a wafer having a first planarization layer formed on the wafer, color filters formed over the first planarization layer, and a second planarization layer formed on the color filters in a first region, the wafer having an indentation formed therein in a second region;
   forming a layer of a filler material over the second planarization layer in the first region and over the wafer in the second region, thereby substantially filling the indentation with the filler material;
   removing a portion of the filler material such that the filler material in the indentation remains;
   forming a microlens material over the second planarization layer;
   removing a portion of the microlens material;
   substantially removing the filler material; and
   forming the microlens from the remaining microlens material.

2. The method of claim 1, wherein the indentation is a bond pad area or a scribe line.

3. The method of claim 1, wherein the filler material is a photoresist material.

4. The method of claim 1, wherein the filler material is a positive photoresist material.

5. The method of claim 1, wherein the microlens material is a photoresist material.

6. The method of claim 1, wherein the microlens material is a positive photoresist material.

7. The method of claim 1, wherein the step of removing a portion of the microlens material includes the steps of:
   applying a mask on the microlens material to define the microlens;
   exposing the microlens material with the mask; and
   developing the microlens material, wherein the microlens material defined to be the microlens remains.

8. The method of claim 1, wherein the filler material is a photoresist material and the step of substantially removing the filler material includes the steps of:
   exposing the filler material; and
   developing the filler material to substantially remove the filler material.

9. A method of forming a microlens comprising the steps of:
   providing a wafer having a first planarization layer formed on the wafer, color filters formed over the first planarization layer, and a second planarization layer formed over the color filters in a first region, the wafer having an indentation formed therein in a second region;
   substantially filling the indentation with a photoresist filler material, the filling being performed at least in part by applying a layer of photoresist material over the second planarization layer in the first region and in the indentation in the second region and by removing photoresist material not located in the indentation;
   forming a microlens material over the second planarization layer;
   exposing the microlens material and the photoresist filler material;
   developing the microlens material and the photoresist filler material; and
   forming the microlens from the remaining microlens material.

10. The method of claim 9, wherein the indentation is a bond pad area and scribe line.

11. The method of claim 9, wherein the photoresist filler material is a positive photoresist material.

12. The method of claim 9, wherein the microlens material is a photoresist material.

13. The method of claim 9, wherein the microlens material is a positive photoresist material.

14. The method of claim 9, wherein the step of exposing the microlens material and the photoresist filler material comprises exposing the microlens material to a first energy and exposing the photoresist filler material to a second energy, wherein the first energy is not equivalent to the second energy.

15. The method of claim 9, wherein the step of exposing the microlens material and the photoresist filler material comprises exposing the microlens material to a first energy and exposing the photoresist filler material to a second energy, wherein the first energy is about 60 mj to 600 mj and the second energy is about 600 mj to 2000 mj.

16. The method of claim 9, wherein the step of removing the microlens material includes the steps of:
   applying a mask on the microlens material to define the microlens;
   exposing the microlens material with the mask; and
   developing the microlens material, wherein the microlens material defined to be the microlens remains.

17. The method of claim 9, wherein the step of developing the microlens material and the photoresist filler material is performed in a single developing stage.

18. A method of forming a microlens comprising the steps of:
   providing a wafer having a first planarization layer formed on the wafer, color filters formed over the first planarization layer, and a second planarization laser formed on the color filters in a first region, the wafer having an indentation formed therein in a second region;
   forming a filler layer over the second planarization layer in the first region and in the indentation in the second region, thereby substantially filling the indentation;

substantially removing the filler layer not located in the indentation;

forming a microlens material over the second planarization layer;

removing excess microlens material;

forming a mask on the wafer, the mask defining the indentation;

etching the wafer in a pattern aligned with the mask to remove the filler layer; and forming the microlens.

19. The method of claim 18, wherein the indentation is a bond pad area or a scribe line.

20. The method of claim 18, wherein the filler layer comprises a photoresist material.

21. The method of claim 18, wherein the filler layer comprises a positive photoresist material.

22. The method of claim 18, wherein the microlens material is a photoresist material.

23. The method of claim 18, wherein the microlens material is a positive photoresist material.

24. The method of claim 18, wherein the step of removing excess microlens material includes the steps of:

applying a second mask on the microlens material defining the microlens;

exposing uncovered areas of the microlens material with the second mask; and developing the microlens material to remove the microlens material not defined as the microlens.

25. The method of claim 18, wherein the mask is formed from a photoresist.

26. The method of claim 18, wherein the step of etching includes the step of removing the mask.

* * * * *

UNITED STATES PATENT AND TRADEMARK OFFICE
CERTIFICATE OF CORRECTION

PATENT NO.    : 6,861,207 B2
DATED         : March 1, 2005
INVENTOR(S)   : Hsu et al.

It is certified that error appears in the above-identified patent and that said Letters Patent is hereby corrected as shown below:

Column 6,
Line 61, delete "laser" and replace with -- layer --

Signed and Sealed this

Tenth Day of May, 2005

JON W. DUDAS
*Director of the United States Patent and Trademark Office*